United States Patent [19]

Jameel et al.

[11] 4,031,460

[45] June 21, 1977

[54] DEVICE FOR MEASURING THE MAGNETIC FLUX DISTRIBUTION ALONG THE LENGTH OF ELONGATED MAGNETIZED ELEMENT

[75] Inventors: Khaja M. Jameel, Glen Ellyn; Von W. Mueller, Elk Grove Village; Ronald A. Foerster, Carol Stream, all of Ill.

[73] Assignee: GTE Automatic Electric Laboratories Incorporated, Northlake, Ill.

[22] Filed: Oct. 31, 1975

[21] Appl. No.: 627,634

[52] U.S. Cl. .......................... 324/34 R; 324/28 RS
[51] Int. Cl.² ...................................... G01R 33/12
[58] Field of Search .......... 324/34 R, 34 H, 34 RS, 324/28 RS, 43 R, 47, 37

[56] References Cited

UNITED STATES PATENTS

| 2,300,999 | 11/1942 | Williams | 324/37 |
| 3,609,529 | 9/1971 | Skubiak | 324/37 |

FOREIGN PATENTS OR APPLICATIONS

| 709,048 | 6/1941 | Germany | 324/43 R |
| 764,393 | 1/1945 | Germany | 324/34 R |
| 147,672 | 2/1961 | U.S.S.R. | 324/34 R |

OTHER PUBLICATIONS

Neumann, H., Messung der Koerzeterkraft, Archiv. fur Technisdes Kessen, (German), V957-2; Mar. 1939, pp. 36-40.

*Primary Examiner*—Robert J. Corcoran
*Attorney, Agent, or Firm*—David W. Heid

[57] ABSTRACT

An apparatus designed for measuring the magnetic flux distribution along magnetizable members, specifically, magnetically latching reed capsules, which apparatus is characterized by an elongate thrust arm, in tubular form, which is mounted to reciprocate along a path provided by spaced support members and which has a drive connection with a motor at one end thereof so that a tubular portion at the opposite end which carries search coils with leads enabling connection to an oscilloscope for recording flux intensity, will telescope the magnetic members which are supported in a holder at that end of the path and which extend into a tubular portion of a bobbin member mounted at that end of the path, within which the search coil is reciprocated and on which an energizing coil may be wound with connection to a current source. The driven end of the thrust arm is transversely slotted for co-operation with a light source and a photo transistor having a connection with the oscilloscope and enabling the oscilloscope to graphically depict the flux distribution along the length of the magnetic members.

14 Claims, 7 Drawing Figures

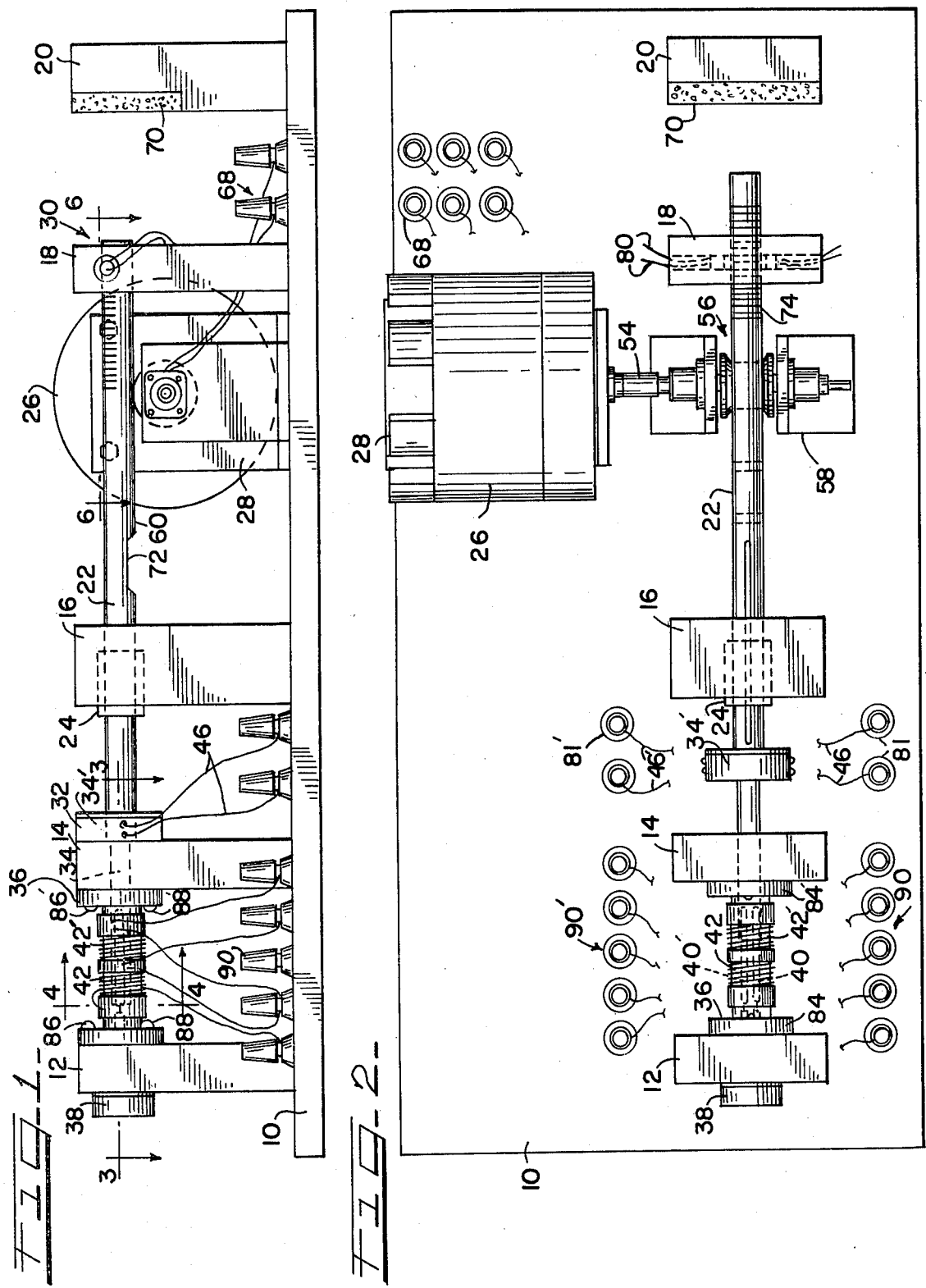

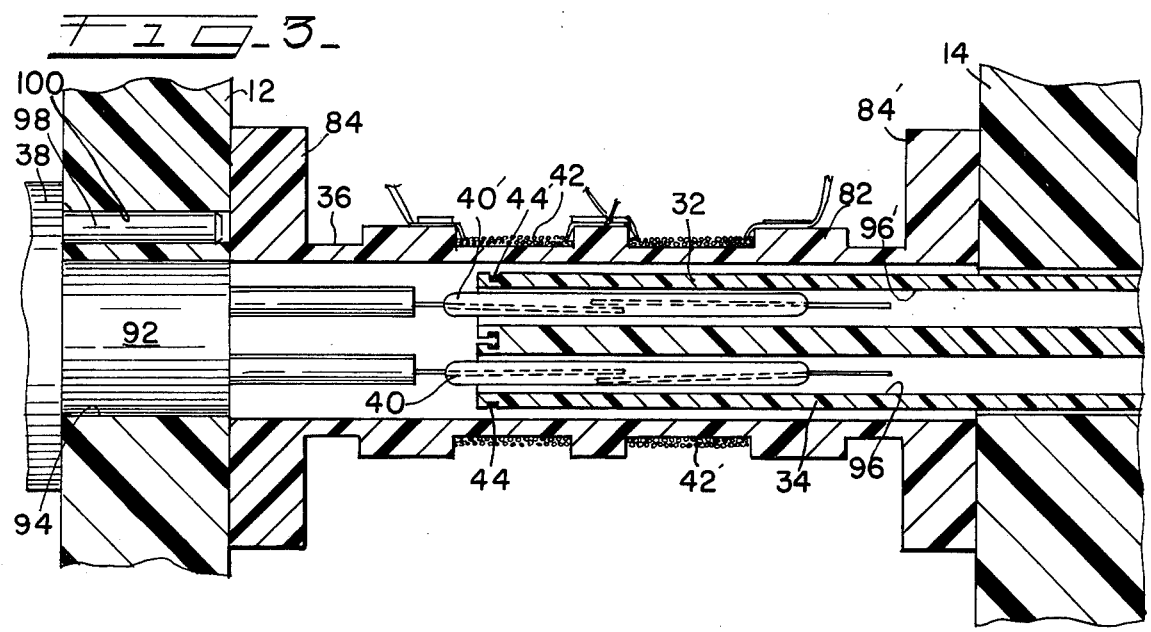
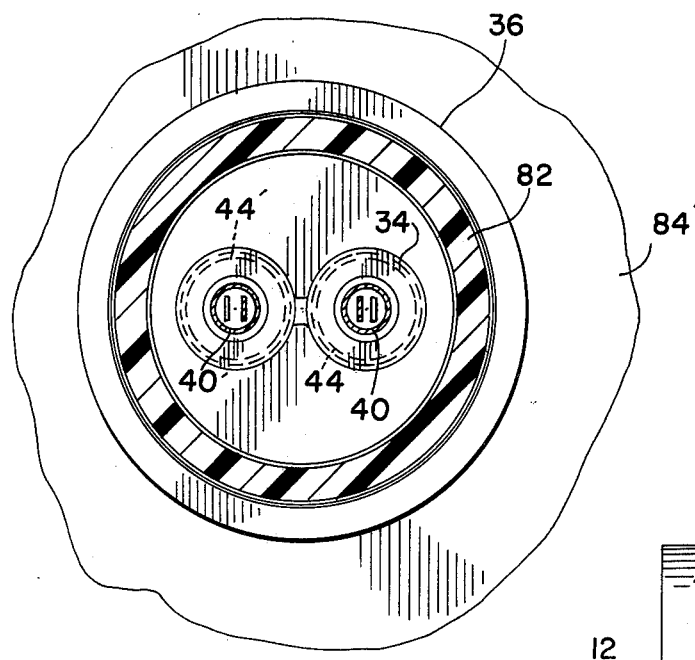
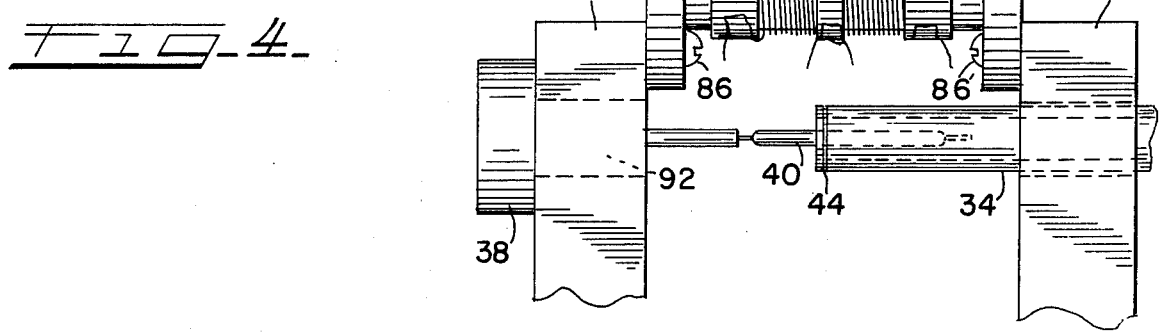

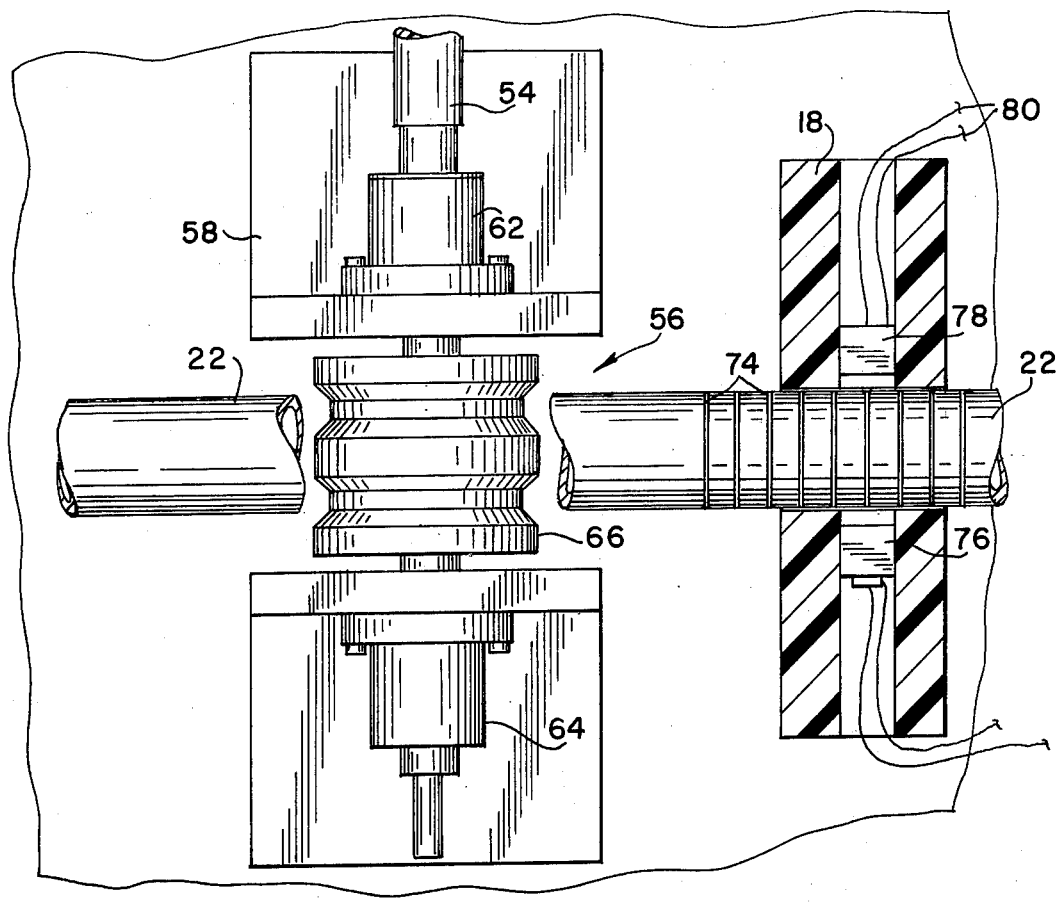
FIG-6-
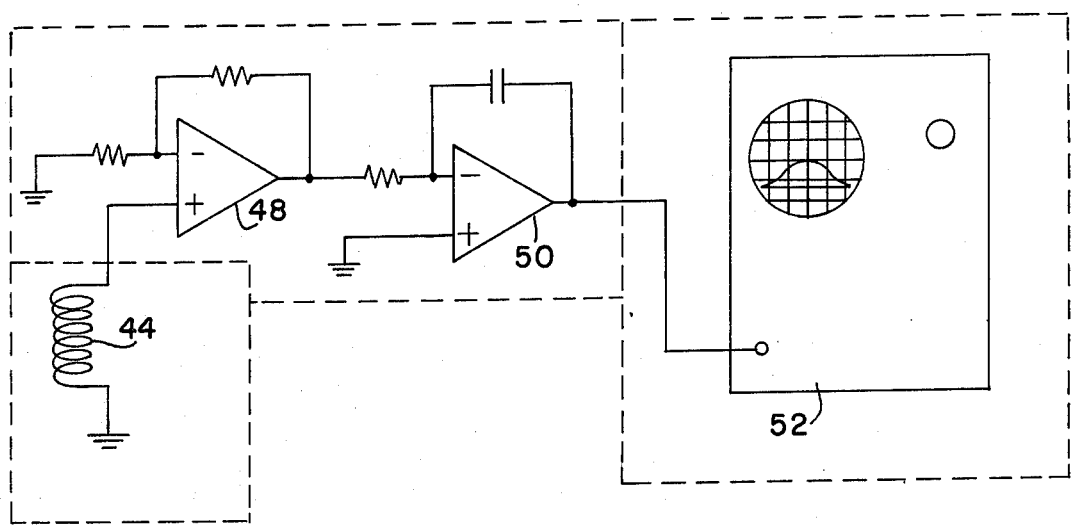
FIG-7-

DEVICE FOR MEASURING THE MAGNETIC FLUX DISTRIBUTION ALONG THE LENGTH OF ELONGATED MAGNETIZED ELEMENT

This invention relates to an apparatus for measuring magnetic flux distribution in a magnetic member and is more particularly concerned with an improved system and apparatus for quickly and accurately determining the intensity of the magnetic flux at points spaced along a magnetic member so as to enable production of a visual display in the form of a graph showing such distribution.

In the design, operation and maintenance of electrical equipment in the communications field and in other fields where reliable and quick acting switching operations are required, the circuitry employed will frequently include magnetic reed switches with pivotally mounted blades in the form of small elongate rod members or capsules of remendur material operating in pairs and which, when exposed to an external magnetic field for a short time, permanently magnetize with the remanent flux produced in the blades a function of the strength of the external field and the relative position of the windings making up the field. In the design of an energizing coil or coils for a magnetically latching reed capsule it is desirable to be able to observe the effect of positioning the energizing windings at various locations along the length of the magnetic latching reed capsule and the resultant remanent magnetic flux distribution established by these fields in the remender material. Heretofore, the flux has been measured by a hysteresigraph which can only measure the flux at a single point, that is, the point where its search coil is wound. Also, in measuring the flux in this manner the original state of the remanent flux is destroyed and the magnetic member must be subjected to a repeated identical energizing field if the measurement is to be duplicated or verified which, of course, is an inducement to errors in measurement. Consequently, the hysteresigraphic method is time consuming and unreliable. It is, therefore, a general object of the invention to provide a method and apparatus for measuring magnetic flux distribution along the length of a magnetically latching reed capsule or any similar rod-shaped magnetic member which enables the user to obtain rapid visual mapping of the flux distribution of the magnetic member with a high degree of accuracy.

It is a more specific object of the invention to provide a mechanical arrangement for use in measuring remanent flux intensity linearly across a magnetically latching reed capsule or similar magnetic member which does not destroy the remament flux so that after being magnetized once the entire flux distribution along the member can be read repeatedly without need for subjecting the member to remagnetization.

A still more specific object of the invention is to provide an apparatus for measuring the magnetic flux intensity along the length of magnetically latching reed capsule or similar magnetic member which comprises a search coil mounted on a tubular portion of a reciprocably mounted thrust arm so that the search coil encircles the magnetic member which is axially aligned with the arm and is carried by the movement of the arm along the length of the magnetic member together with associated mechanism for recording in the form of a graph the flux intensity in relation to the travel of the search coil.

To this end, the invention as claimed herein is embodied in a supporting frame structure having an elongate thrust arm mounted for reciprocating movement by means of a friction connection with a motor drive element, which thrust arm has a tubular end portion moving in a path in which a reed capsule is supported so that it is telescoped by said end portion of the thrust arm and having a search coil mounted thereon so as to sweep the length of the reed capsule which may be magnetized by an energizing coil supported on a hollow bobbin member within which the tubular end portion on the thrust arm reciprocates, the search coil being connected into a circuit which operates associated mechanism for recording, in the form of a graph, the flux intensity in relation to the travel of the search coil.

The aforesaid objects and other objects and advantages of the invention will become more apparent when reference is had to the accompanying detailed description of the preferred embodiment of the invention which is set forth therein, by way of example, and shown in the accompanying drawings wherein like reference numerals indicate corresponding parts throughout.

FIG. 1 is a side elevational view of an apparatus for measuring the intensity of magnetism along magnetically latching reed capsules, or similar magnetic members, which apparatus embodies the principal features of the invention;

FIG. 2 is a plan view of the apparatus shown in FIG. 1;

FIG. 3 is a horizontal sectional view taken on the line 3—3 of FIG. 1, to an enlarged scale;

FIG. 4 is a cross sectional view, taken on the line 4—4 of FIG. 1 to an enlarged scale;

FIG. 5 is a fragmentary elevational view at the one end of the apparatus, as viewed in FIG. 1, with part of the mechanism moved to a different position;

FIG. 6 is a horizontal sectional view taken on the line 6—6 of FIG. 1, to an enlarged scale; and FIG. 7 is a diagrammatic view showing the amplifier-integrator circuit employed with the apparatus and an oscilloscope for obtaining a graphic representation of the flux intensity in a magnetic member.

Referring first to FIGS. 1 and 2, there is illustrated a Linear Magnetic Flux Measuring Mechanism (LMFMM) which embodies the principal features of the invention and which is especially adapted for use in measuring the intensity of magnetism along a magnetic member whose polarity of magnetization changes along its linear length, such as, for example, a magnetically latching reed capsule containing two blades of remendur material, which, when exposed to an external magnetic field for a short time, permanently magnetize, with the remanent flux produced in the blades a function of the strength of the external magnetic field and the relative position of the windings making up the field.

The testing or measuring mechanism, as illustrated, is designed for testing two of the switch blades, simultaneously, and facilitates the design of the energizing coils for the reed capsule assembly. The mechanism is mounted on a base plate 10 having a plurality of upright members in the form of posts 12, 14, 16, 18 and 20 which are in spaced alignment with each other and which define a linear path for supporting a reciprocably mounted thrust arm 22 and and associated elements. The thrust arm 22 is mounted in a bearing support member 24 on the upright post member 16 and a motor 26 is arranged on a supporting frame 28 with a friction drive connection for reciprocably moving the thrust arm 22 in a horizontal path. A position sensing means 30 is provided at the upright post member 18 for cooperation with the arm 22 to track the movement of the arm 22. A search coil and carrier assembly 32 is secured on the end of the thrust arm 22 which assembly 32 includes a double barrel tubular end portion or end member 34. Said end portion 34 extends through a guideway in the upright post member 14 and telescopes within a bobbin 36 mounted between the upright post member 14 and the end upright post member 12 when the thrust arm 22 is reciprocated. A reed capsule holder 38 is supported on the end post 12 which is adapted to support two reed capsule blades 40,40' in side by side relation within the bobbin assembly 36, the latter providing a support for winding thereon the energizing coils 42,42' for magnetizing the two reed capsule blades 40,40'.

The search coil and carrier assembly 32 (FIGS. 1 to 5) which comprises the carrier portion in the form of a double barrel tube 34 with a base flange 34' for attaching to the thrust arm 22, and the search coils 44 and 44' per se, is carried in a horizontal path by thrust arm 22. The search coils 44,44' constitute the "eye" of the apparatus. The assembly 32 includes the pair of search coils 44,44', each of which consists of a predetermined number N turns of wire wound around a narrow bobbin or notch in the tube, for example, in the form of the apparatus illustrated 100 turns of No. 46 ½ gauge wire were employed for each of the coils. The axial dimension of the coil is kept as small as possible. The coils 44,44' are mounted, side by side, on the end portion of the tube 34 so as to telescope the blades 40,40'. As the search coils 44,44' are moved along the length of the blades 40,40' by reciprocation of arm 22 a voltage is produced at the leads 46,46' which is proportional to the speed at which the coils move. The faster the sweep of the coils along the magnetic bodies or blades the higher the voltage and the less time required to transverse the length of the latter. The slower the sweep the lower the voltage and the longer the time in which the voltage is present. However, for a given amount of remanent flux in the magnetized member which is to be measured, the cumulating sum of the product of the voltage and the time this voltage is present at the search coil leads as the coil is swept over the entire magnetic member equals the remanent magnetic flux at the point where the search coil surrounds the member. The search coil tracks the flux as the coil passes along the magnetic member being measured. In mathematical terms the flux equals the integral of the voltage-second product, that is $\phi = \int e dt$.

In FIG. 7 there is depicted diagrammatically the amplifier-integrator circuitry employed with the apparatus to provide a visual reading on an oscilloscope of the flux distribution. The moving search coil 44 or 44' provides a time varying voltage and the relatively weak or small signal is conducted through an amplifier 48 and an integrator 50 to an oscilloscope 52. The integrating function performs the summing of volt-second product which equals the magnetic flux. The oscilloscope or plotter 52, which gives a visual mapping of the flux distribution of the magnetic member is connected to the amplifier-integrator output and responds to that output level in the "Y" or vertical direction. The "X" or horizontal direction is a controlled time linear sweep, whose sweep is determined by convenience of scale and which begins sweeping the same time the search coil traverses the length of the magnetic member to be measured.

The thrust arm 22 on which the search coils 44 and 44' are carried and moved to sweep along the magnetic bodies 40,40' is designed to provide a fairly consistent sweep with regard to time and linear movement. The thrust arm 22 is supported in a linear motion bearing 24 in the upper portion of the upright member 16 and extends at the trailing end to the upright member 18. It is driven by the motor 26 which is basically a constant RPM synchronous motor and which is supported on a mounting frame 28 disposed between the upright members 16 and 18 with its circular motion transformed to drive an output shaft 54 on which there is a clutch driven wheel assembly 56 supported on frame 58 and disposed for friction engagement with the bottom edge or face 60 of the thrust arm 22. The drive wheel assembly 56 includes an electromagnetic clutch 62 and an electromechanical brake 64 which is operative to stop the wheel 66 when the clutch is disengaged, the clutch and brake functions being controlled electronically in a known manner with leads running from the binding posts 68. The end upright 20 has mounted thereon a bumper pad 70, of foam or similar material, which is aligned for engagement by the end of the thrust arm 22 when the latter reaches the end of its retracting movement. A recess 72 is provided in the bottom face 60 of the thrust arm 22 which is spaced longitudinally of the arm 22 so as to break the friction drive connection with the drive wheel 66 and prevent overdrive in the retracting direction, in the event the mechanism controlling the rotation of the drive wheel 66 fails to stop the drive wheel at the proper time.

The thrust arm 22 is provided with a series of cross slots 74 which are spaced at predetermined intervals at the end adjacent the upright 18 for actuating the mechanism 30 for sensing the longitudinal movement of the arm 22. A light source 76 (FIG. 6) is positioned on one side of the path of the slots 74 and a photo transistor 78 at the other side which is electrically connected by leads 80 to the oscilloscope 52 and provides a deflection on an addition trace alongside the flux distribution trace shown on the oscilloscope. Since the velocity of the search coil 44 is not constant, due mainly to the inertia of the thrust arm 22 and the search coil assembly, while the sweep velocity of the oscilloscope in the horizontal direction is a constant, it is necessary to reference the two sweeps to one another in order to determine the exact location shown on the magnetic member with a point along the trace made on the oscilloscope. With the arrangement provided an exact correlation exists between the flux shown on the oscilloscope trace and its location on the magnetic member which is being measured.

The moving search coil mechanism 32 which is illustrated is designed specifically for measuring the flux of two magnetically latching reed capsule blades which are positioned side-by-side as shown in FIGS. 2 and 3, and two search coils 44 and 44' are provided on the double tube or double barreled search coil carried member 34 which constitutes a part of the search coil and carrier assembly 32 on the free end of the thrust arm 22. Each of the search coils 44 and 44' is secured on the end of the carrier member 34 with its leads seated in axially extending grooves which lead to the flange portion 34' where the leads have flying portions 46,46' connecting to pairs of binding posts 81 and 81' and thence to the amplifier-integrator circuit.

The reed capsule blades 40 and 40' are mounted in a holder 38 which is supported on the end upright member 12 with the blades 40,40' extending through the upright 12 and into the tubular portion 82 of the bobbin 36 on which the energizing coils 42,42' for the blades are mounted and connected to a current source. The search coil assembly 32 is moved to the left in FIG. 1 to bring the search coils to a ready position where they are to the left of the blades 40,40' as shown in FIG. 1. Upon energizing the clutch, the drive wheel 66 drives the thrust arm 22 to the right and the oscilloscope begins to sweep. The output of the amplifier-integrator is fed into the oscilloscope which is sweeping in the horizontal direction and the flux pattern is shown by the deflection of the vertical axis. Knowing the number of turns N on the search coil 44 and 44', the amplifier gain and the integrator time constant RC, the exact value of flux in maxwells can be read off the oscilloscope screen. Algebraically, the deflection in volts is equated to the remanent flux in maxwells by the following formula:

$$\phi \text{ (maxwells)} = \frac{\text{Volt deflection on Oscilloscope}}{(N \text{ search coil}) \times (\text{Gain of amplifier})} \times \frac{1}{\left(\frac{1}{RC}\right) \times (10^{-8})}$$

The bobbin 36 is in the form of a spool having a tubular body or core portion 82 (FIGS. 3, 4 and 5) and end flange portions 84,84' with the latter adapted to be secured in properly aligned position on the posts 12 and 14 by screw fasteners 86, 88 and 86', 88' which are arranged in axially aligned pairs so that the bobbin assembly 36 may be pivoted on the one pair of screws 86,86' to an out of the way or inoperative position shown in FIG. 5 when the holder 38 is removed and the thrust arm 22 is in retracted position, providing access to the end portion 34 of the assembly 32 without dismantling the latter. Binding posts 90 and 90' are provided on the plate 10 facilitate connecting the ends of coils 42,42' to a current source.

The holder 38 (FIGS. 3 and 4) for the reed capsule blades 40,40' is formed with a barrel portion 92 which is adapted to seat in sliding relation in an aperture 94 in the end post member 12 so as to align the blades 40,40' for telescoping into the chambers 96,96' in the double barrel portion 34 of the assembly 32 which are of a size to receive the blades 40,40'. A locating pin 98 is provided on the holder 38 and a cooperating bore 100 is provided in the post 12 to insure proper positioning of the blades 40,40' so that they will telescope within the search coil carrier portion 34.

What is claimed is:

1. An apparatus for use in the measuring magnetic flux distribution along a magnetic member which is in the form of an elongate rod of relatively small cross sectional diameter, said apparatus comprising a support frame having a plurality of upstanding post forming support members spaced along a linear path, an elongate rod member constituting a thrust arm supported by said post members for reciprocating movement along said linear path between extended and retracted positions, drive means for reciprocating said thrust arm, said thrust arm having a hollow end portion of a length and cross section which will accommodate in telescoped relation therein said magnetic rod member, means for supporting said magnetic rod member in axial alignment with said hollow end portion of said thrust arm so as to be telescoped within said hollow end portion when said thrust arm is extended, bobbin forming means having a hollow tubular core portion of a cross section which will receive in telescoped relation said hollow end portion of said thrust arm and mounted in telescoping relation to said magnetic member, said bobbin forming means adapted to have wound thereon an energizing coil for said magnetic member, a search coil having an axial dimension only a small fraction of the length of the magnetic member, mounted on the hollow end portion of said thrust arm so as to sweep along the length of said magnetic member upon retractive member of said thrust arm, and means associated with said search coil and said thrust arm for sensing and recording magnetic flux values at discrete points along the length of the magnetic member and the position of said search coil along said magnetic member as said thrust arm is reciprocated and correlating the two measurements.

2. An apparatus as set forth in claim 1 wherein said drive means for reciprocating said thrust arm comprises a drive motor and a clutch operated wheel driven by said motor and in frictional engagement with a portion of said thrust arm so as to reciprocate said thrust arm in an axially directed path.

3. An apparatus as set forth in claim 2 wherein the portion of said thrust arm which has frictional engagement with said wheel is interrupted at a point which will operate to break the frictional connection with said wheel when said thrust arm reaches a predetermined point in its retractive movement thereby to prevent movement beyond said point.

4. An apparatus as set forth in claim 1 wherein said means for sensing and recording the position of said search coil along said magnetic member includes a series of axially spaced transverse slots in said thrust arm for cooperation with a light source and a light sensor disposed along opposite sides of the path traversed by the slotted portion of said thrust arm.

5. An apparatus as set forth in claim 1 wherein said means for supporting said magnetic rod member comprising a holder for said magnetic rod member and means for removably mounting said holder on an end most post forming member of said support frame so as to position said magnetic rod member for telescoping within the hollow end of said thrust arm.

6. An apparatus as set forth in claim 1 wherein said bobbin forming means comprises a tubular core member and flange end portions enabling said bobbin forming means to be mounted between upright post members with the flanged end portions seated against confronting vertical surfaces on said post members.

7. An apparatus as set forth in claim 6 wherein said flanged end portions of said bobbin forming means have a pivotal connection with said post members enabling said bobbin forming means to be swung to an inoperative position about an axis which is parallel with and offset relative to said linear path.

8. An apparatus as set forth in claim 1 wherein said search coil comprises a relatively small wire coil mounted on the free end of the hollow end portion of said thrust arm so as to telescope said magnetic member and move in an axial path along said magnetic member when said thrust arm is retracted.

9. An apparatus for use in the measuring magnetic flux distribution along a magnetic member which is in the form of an elongate rod, said apparatus comprising a support frame having a plurality of upstanding support members which are spaced along a linear path, an elongate rod member constituting a thrust arm, said upstanding support members having means supporting said thrust arm for reciprocating movement along said linear path between extended and retracted positions, means for driving said thrust arm, said thrust arm having an axially extending member at the end thereof which will accommodate in telescoped relation said magnetic member, means for supporting said magnetic member in axial alignment with said end member of said thrust arm so as to be disposed within said end member when said thrust arm is in extended position, means forming a bobbin with a tubular portion of a cross section which will receive in telescoped relation said end member of said thrust arm, said bobbin forming means being adapted to have wound thereon an energizing coil for said magnetic member, means mounting said bobbin forming means on said support members with the tubular portion axially aligned with the end member of said thrust arm, a flux sensing member having an axial dimension only a small fraction of the length of the magnetic member, carried on said thrust arm end member so as to travel in the lengthwise direction of said magnetic member upon retractive member of said thrust arm, and means associated with said flux sensing member and said thrust arm for recording the magnetic flux values at discrete points along the length of said magnetic member which is traversed by said flux sensing member, and correlating the flux values with the position of the sensing member.

10. An apparatus as set forth in claim 9 wherein said means for supporting said magnetic member comprises a holder for said magnetic member and means for removably supporting said holder with the magnetic member extending into said tubular portion of said bobbin forming means.

11. An apparatus as set forth in claim 9 wherein said bobbin forming means is in the form of a spool with flanged end members adapted to be mounted between upstanding frame members and said mounting means enabling said bobbin forming means to be provided to an inoperative position out of the path of said thrust arm.

12. An apparatus as set forth in claim 9 wherein said flux sensing member comprises a wire coil mounted on said thrust arm end member.

13. An apparatus as set forth in claim 9 wherein said axially extending member at the end of said thrust arm is in the form of a double barrel tube with a flanged end which is secured on said thrust arm.

14. An apparatus as set forth in claim 9 wherein said means for recording the magnetic flux distribution includes means for sensing and recording the movement of said thrust arm as the flux sensing member is carried along the length of said magnetic member.

* * * * *

UNITED STATES PATENT AND TRADEMARK OFFICE
CERTIFICATE OF CORRECTION

PATENT NO. : 4,031,460
DATED : June 21, 1977
INVENTOR(S) : Khaja M. Jameel et al.

It is certified that error appears in the above-identified patent and that said Letters Patent are hereby corrected as shown below:

Column 6, line 14, "member" should be --movement--
line 56, after "flange" insert --forming--

Column 7, line 32, "member" should be --movement--

Column 8, line 16, "provided" should be --pivoted--

Signed and Sealed this

Twenty-seventh Day of September 1977

[SEAL]

Attest:

RUTH C. MASON
Attesting Officer

LUTRELLE F. PARKER
Acting Commissioner of Patents and Trademarks